United States Patent [19]

Liang et al.

[11] Patent Number: 4,977,059
[45] Date of Patent: Dec. 11, 1990

[54] SULFONATED-ETHYLENE OXIDE DISPERSANTS FOR USE IN PREPARING AMINE-FORMALDEHYDE MICROCAPSULES

[75] Inventors: Rong-Chang Liang; William H. Simpson, both of Centerville; Katherine A. Gyure, Miamisburg; Kenneth P. Carpenter, Dayton, all of Ohio

[73] Assignee: The Mead Corporation, Dayton, Ohio

[21] Appl. No.: 352,063

[22] Filed: May 12, 1989

[51] Int. Cl.$^5$ .................... G03C 1/04; C08F 30/04; A61J 5/00
[52] U.S. Cl. .................... 430/138; 430/621; 430/629; 430/634; 430/635; 430/636; 526/240; 526/258; 526/287; 546/341; 562/42; 562/105; 562/107; 562/109; 264/4.1; 264/4.7; 428/402.2; 428/402.21
[58] Field of Search ............... 430/138, 621, 629, 634, 430/635, 636; 526/240, 258, 287; 546/341; 562/42, 105, 107, 109; 264/4.1, 4.7; 428/402.2, 402.21

[56] References Cited

U.S. PATENT DOCUMENTS

| | | | |
|---|---|---|---|
| 3,284,393 | 11/1959 | Vanderhoff et al. | 260/29.6 |
| 3,970,604 | 7/1976 | Wentworth | 526/287 |
| 4,151,149 | 4/1979 | Smith | 526/287 |
| 4,200,563 | 3/1978 | Komiya | 260/29.6 |
| 4,439,581 | 8/1982 | Irii et al. | 524/839 |
| 4,520,182 | 8/1983 | Turner et al. | 526/307.2 |
| 4,528,348 | 8/1983 | Turner et al. | 526/225 |
| 4,608,425 | 6/1985 | Peiffer et al. | 526/241 |
| 4,618,448 | 9/1985 | Cha et al. | 252/180 |
| 4,746,467 | 6/1986 | Sakamoto et al. | 264/4.7 |
| 4,788,124 | 11/1988 | Wright | 430/138 |
| 4,833,062 | 5/1989 | Kakimi | 430/138 |

FOREIGN PATENT DOCUMENTS

1036309 2/1986 Japan .................... 526/240
1047713 3/1986 Japan .................... 526/240

Primary Examiner—Paul R. Michl
Assistant Examiner—Hoa Van Le
Attorney, Agent, or Firm—Thompson, Hine and Flory

[57] ABSTRACT

A method for forming microcapsules by enwrapping an oily core material in a formaldehyde condensation product formed in situ wherein a dispersant is used of the formula (I):

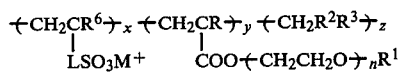

where:
M is an alkali metal cation or a quaternary ammonium group,
L is —$(CH_2)_p$, —$COO(CH_2)_p$, —$C_6H_4$— or a direct bond;
R, $R^2$ and $R^6$ are the same or different and represent a hydrogen atom or a methyl group;
$R^1$ is a hydrogen atom, an alkyl group having 1 to 4 carbon atoms, or —$SO_3M$ where M is defined as above; $R^3$ is —$COOR^4$, —$CONHR^4$, —CO—$R^4$, a pyridinyl group or quaternary salt thereof, —$COOCH_2CH_2N(CH_3)_2$—, —$COOCH_2CH_2N_4(CH_3)_3Cl$— group having 1 to 12 carbon atoms, an aralkyl group, an aryl group, or —$(CH_2)_m$—OOC—$CR^2CH_2$, —$(OCH_2CHhd 2)_m COO—CR^2CH_2$ or —$(CH_2)_m NHCO—CR^2CH_2$;
x is about 0.4 to 0.8;
y is about 0.2 to 0.6;
z is about 0 to 0.1;
n is an integer greater than or equal to 1.
m is an integer of 1 to 4; and
p is an integer of 0 to 4.

The compound of claim 1 wherein x is about 0.5 to 0.7, y is about 0.3 to 0.5 and z is about 0.005 to 0.05.

25 Claims, 1 Drawing Sheet

SULFONATED-ETHYLENE OXIDE DISPERSANTS FOR USE IN PREPARING AMINE-FORMALDEHYDE MICROCAPSULES

BACKGROUND OF THE INVENTION

The present invention relates to an improved method for preparing amine-formaldehyde microcapsules and, more particularly, to a novel dispersant useful therein. Still more particularly the invention relates to a novel method for preparing microcapsules containing a photohardenable composition.

Recently, a novel photosensitive material which employs microcapsules containing a photohardenable composition has been developed. This photosensitive material is described in its most basic form in U.S. Pat. Nos. 4,399,209 and 4,440,846 to The Mead Corporation. A preferred photosensitive material is sensitive to visible light and is useful in reproducing full color images and is described in U.S. Pat. Nos. 4,772,530 and 4,772,541. A photosensitive material has also been developed by Fuji Photo Film Co. which uses a silver halide to initiate polymerization of the photohardenable composition in the microcapsules as described in European Patent Publication Nos. 0203613; 0228083; 0234580; and 0228053.

Images are formed using the aforesaid photosensitive materials by image-wise exposing a layer of photohardenable capsules to actinic radiation and rupturing the capsules by passing an imaging sheet containing the capsules through a pressure nip. In the most typical embodiments, the microcapsules contain a polyethylenically unsaturated monomer which polymerizes upon exposure. In the silver-based system, the photosensitive material must be heated after exposure to cause the photohardenable composition to harden. Due to the difference in the hardness of the capsules in the exposed versus the unexposed areas, only certain capsules release their contents when they are subjected to pressure in the pressure nip. If the internal phase contains a dye precursor, the dye precursor is image-wise released. A color image is formed upon transferring the dye precursor to a developer layer. In previously disclosed embodiments, the developer layer may be present on the same support as the layer of capsules (U.S. Pat. No. 4,440,846) or on a separate support (U.S. Pat. No. 4,399,209).

One of the preferred methods for preparing microcapsules useful in the aforementioned photosensitive materials is by in situ polymerization of an amine-formaldehyde resin, more particularly, a melamine-formaldehyde resin. In these methods, the photohardenable composition and other constituents of the internal phase of the microcapsules are dispersed in water and an amine-formaldehyde prepolymer or the amine and the formaldehyde individually are added and the capsule is formed in situ by an acid catalyzed condensation reaction. Such methods are well known in the art, however, for optimum sensitometric performance in the aforementioned photosensitive materials, it has been found that the microcapsules should have a fairly uniform small particle size. A particle size of 4 to 8 microns has been suggested.

Previously, methods for preparing amine-formaldehyde microcapsules useful in the aforementioned photosensitive materials have been described in commonly assigned U.S. Pat. No. 4,608,330. In these methods the microcapsules are formed in an aqueous phase containing pectin as a viscosity modifier and a water soluble polymer such as isobutylene-maleic anhydride copolymer. More recently, methods have been described in U.S. application Ser. No. 128,292 filed Dec. 3, 1987 in which the aqueous phase contains pectin and sodium polystyrene sulfonate. U.S. Pat. No. 4,746,467 discloses a method for preparing amine-formaldehyde microcapsules in an aqueous solution of a water soluble copolymer of acrylic acid, styrene sulfonic acid, and an alkyl acrylate or methacrylate.

While these previous methods have been successful, they have not been completely satisfactory. Because pectin is a natural product its properties tend to vary seasonally as well as from one supplier to another. Due to the nature of sulfonation process, sulfonated polystyrenes also suffer a strong batch-to-batch variation. It would be desirable to design a method for producing microcapsules useful in the photosensitive materials described in the patents referenced earlier which have a uniform small size and which is not dependent on the use of pectin and/or sulfonated polystyrene. Attempts have been made to use other dispersants, such as hydroxy ethyl cellulose, polyvinyl alcohols, Caboset ® materials, but they have not been satisfactory. To be useful as a dispersant the compound (1) must have suitable viscosity characteristics; (2) in the case of microcapsules containing silver based photohardenable compositions, must not consume alkali and must not invert the first silver halide/oil emulsion; (3) must not cause gelling or crosslinking upon storage; and (4) must have the appropriate surface activity to deposit the capsule wall at the oil/water interface.

SUMMARY OF THE INVENTION

In its broadest context, the present invention is directed to a novel polymeric dispersant of the formula (I)

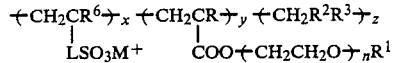

where:
M is an alkali metal cation (preferably a sodium or potassium cation) or a quaternary ammonium group,
L is $-(CH_2)_p$, $-COO(CH_2)_p$, $-C_6H_4-$ or a direct bond,
R, $R^2$ and $R^6$ are the same or different and represent a hydrogen atom or a methyl group;
$R^1$ is a hydrogen atom, an alkyl group having 1 to 4 carbon atoms (preferably a methyl ), or $-SO_3M$ where M is defined as above; $R^3$ is $-COOR^4$, $-CO-R^4$, $-CONHR^4$, a pyridinyl group or quaternary salt thereof, $-CO_2CH_2CH_2N(CH_3)_2$, $-COOCH_2CH_2N^+(CH_3)_3Cl^-$ where $R^4$ is an alkyl group having 1 to 12 (preferably 6 to 10) carbon atoms, an aralkyl group (such as a benzyl group), an aryl group (such as a phenyl group), or $-(CH_2)_m-OOCCR^2CH_2$, $-(OCH_2CH_2)_mCOO-CR^2CH_2$, or $-(CH_2)_mNHCO-CR^2CH_2$;
x is about 0.4 to 0.8 and preferably about 0.5 to 0.7;
y is about 0.2 to 0.6 and preferably about 0.3 to 0.5;
z is about 0 to 0.1 and preferably 0.005 to 0.05;
n is an integer greater than or equal to 1 and preferably 4 to 30.
m is an integer of 1 to 4; and
p is an integer of 0 to 6.

The emulsifier of the present invention is particularly desirable because its viscosity and surface activity can be controlled readily by manipulating monomer selection and ratios within the aforementioned ranges.

The present invention is more particularly directed to a method for forming amine formaldehyde microcapsules which comprises enwrapping particles of an oily core material in polymeric shells formed by in situ polymerization of an amine and formaldehyde wherein the aqueous phase contains a dispersant of the formula (I). More particularly, the present invention is directed to a process for forming melamine-formaldehyde microcapsules wherein the aqueous phase contains a dispersant of the formula (I) alone or in combination with sulfonated polystyrene.

Still more particularly, the present invention relates to a method for preparing amine-formaldehyde microcapsules containing a photohardenable composition and preferably a silver based photohardenable composition prepared by the aforementioned process and preferred process.

The present invention also relates to microcapsules prepared by the foregoing process and to a photosensitive material comprising a support having a layer of microcapsules prepared by the aforementioned process provided on the surface thereof.

DETAILED DESCRIPTION OF THE INVENTION

Figure 1:
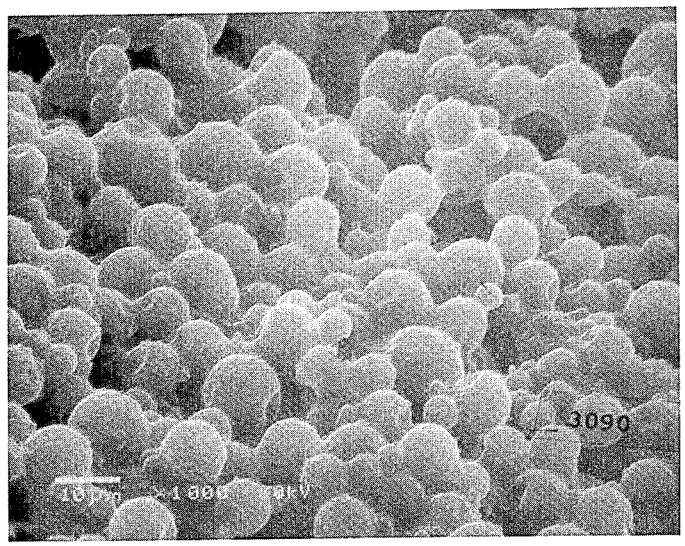
FIGS. 1 and 2 are electron microscope photographs of microcapsules prepared in Example 2 and the comparison example, respectively.

The dispersants of the present invention are prepared by copolymerizing a monomer mixture including a polyoxyethylene containing monomer (A) represented by the formula (II)

$$CH_2=C-C(-OCH_2CH_2)_n-OR^1 \quad (II)$$
$$\quad | \quad ||$$
$$\quad R \quad O$$

where R, $R^1$ and n are defined as above;
a vinyl monomer (B) containing a sulfonic acid or salt of the formula (III)

$$CH_2=CR^6-LSO_3^-M^+$$

where M, $R^6$, and l are defined as above; and optionally a monomer (C) of the formula (IV):

$$CH_2=CR^2R^3 \quad (IV)$$

where $R^2$ and $R^3$ are defined as in formula (I).

The vinyl monomers represented by the general formula (II) are acrylic acid esters or methacrylic acid esters containing combined thereto polyoxyethylene units. For example, there may be mentioned polyethylene glycol monoacrylate or methacrylate, methoxypolyethylene glycol monoacrylate or methacrylate, and alkyl substituted phenoxypolyethylene glycol monoacrylate or methacrylate such as polyethylene glycol (9 mol) mono(meth)acrylate, polyethylene glycol (23 mol) mono(meth)acrylate, methoxypolyethylene glycol (9 mol) mono(meth)acrylate, methoxypolyethylene glycol (23 mol) mono(meth)acrylate, polyethylene glycol (30 mol) mono(meth)acrylate, and phenoxypolyethylene glycol (30 mol) mono(meth)acrylate. As the chain length of the polyethylene oxide unit increases, the viscosity of the dispersant increases.

The monomer B is preferably alkali metal salts of p-styrene sulfonic acid and still more particularly sodium p-styrene sulfonate. Among the vinyl monomers containing sulfonic acid or a salt thereof represented by the general formula (III), there may be mentioned unsaturated hydrocarbonsulfonic acids, for example vinylsulfonic acid, allysulfonic acid, methallylsulfonic acid, α-styrenesulfonic acid and their alkali metal salts or ammonium salts; acrylic or methacrylic acid sulfoalkyl esters, for example sulfobutyl acrylate, sulfoethyl acrylate, sulfopropyl methacrylate and their alkali metal salts and ammonium salts.

The monomer C is optional and is added where the viscosity and/or surface activity of the polymer must be adjusted to meet a particular demand. For example, by introducing a small amount of vinyl pyridine or its quaternized salts into the modifier, coulombic interaction between the anionic charge of the sulfonate and the cationic charge of the quaternized vinyl pyridine increases viscosity. Similarly small amounts of hydrophobic monomers such as octyl acrylamide, dodecyl acrylate, etc. increase viscosity through hydrophobic association and control surface activity to achieve optimal encapsulation or emulsion stability. Use of a diacrylate or diacrylamide may yield higher viscosity through crosslinking.

Representative examples of monomer C include the following: 2-and 4-vinyl pyridine and their quantierized salts, 2-(N,N-dimethyl)aminoethyl (meth)acrylate and its quanterized slats, alkyl(meth)acrylates, N-alkyl(meth)acrylamide, $$CH_2=C-C-O(CH_2)_mOC-C=CH_2$$
$$\quad | \quad || \quad \quad || \quad |$$
$$\quad R^2 \quad O \quad \quad O \quad R^2$$

$$CH_2=C-C-O(CH_2CH_2O)_m-C-C=CH_2$$
$$\quad | \quad || \quad \quad || \quad |$$
$$\quad R^2 \quad O \quad \quad O \quad R^2$$

$$CH_2=C-C-NH(CH_2)_mNHC-C=CH_2$$
$$\quad | \quad || \quad \quad || \quad |$$
$$\quad R^2 \quad O \quad \quad O \quad R^2$$

The monomers are reacted in amounts to provide molar ratios within the ranges and preferred ranges set forth for x, y, and z with respect to formula (I). The reaction may be carried out in an otherwise conventional manner. Typically, the dispersants may be prepared by solution or inverse emulsion polymerization. For example, the reaction is carried but at an acid pH (e.g., 4.5) and in the presence of a catalyst such as ammonium persulfate. In producing and reproducing the dispersant, the main concern lies in controlling the viscosity and in turn the molecular weight of the product. There are three factors which directly affect both. For a given chemical structure the most crucial of these factors is the concentration of monomer in the initial charge. If the concentration is too low to have the "gel effect" (P. J. Flory, "Principles of Polymer Chemistry", CHVIV (1953), the termination process may not be reduced efficiently. Low molecular weight and low viscosity polymers with low conversion will result. If too much monomer is present in the initial charge the molecular weight will increase too rapidly and side-chain reactions will occur causing the polymer to become a crosslinked insoluble gel. Termination is a function of viscosity. As the reaction's viscosity increases the rate of termination decreases, while the rate of propagation and chain transfer remain unchanged.

It is necessary to optimize the initial monomer concentration in order to achieve the desired viscosity while still enabling the reaction to demonstrate the Weissenberg Effect. The Weissenberg Effect can be described as the steady creeping of polymer up the rotating stir shaft.

The second most important factor in product control is the point at which additional monomer is added to the initial charge. If the viscosity of the polymer is not high enough when addition begins, dilution of the reaction by the monomer solution will result in a reduction of the gel effect and in turn the rate of polymerization and molecular weight. If the monomer is added after the reaction is too viscous, the reaction will most likely proceed until the polymer turns to a non-water soluble gel. The optimum point for the addition of additional monomer is when the reaction displays a noticeable Weissenberg Effect. The exact height of the creeping polymer at the point of monomer addition must be noted as it is crucial for reproducibility among batches. The last factor which contributes to product control is the length of post-heating after monomer addition is finished. The longer the post-heating the less residual monomer and the more viscous the product.

The dispersants of the present invention may range from about 30 to 500 cps and more preferably 180 to 230 cps (300D (1/sec)) at 25° C. at a concentration of 5% or less in water. For use in preparing microcapsules they preferably are greater than 200 cps at a concentration less than 5% in water. The molecular weight of the dispersant ranges from about $10^3$ about $10^3$ to $10^6$. For use in preparing silver based microcapsules, the dispersant must not react with base.

Methyl or other alkyl is preferred for the $R^1$ in formula (I), to avoid any undesirable crosslinking reaction with formaldehyde in the wall-building step and during storage.

In accordance with the preferred embodiments of the present invention, microcapsules are prepared by emulsifying an oily material in an aqueous medium containing the dispersant of formula (I) alone or with a water-soluble polymer. Useful water soluble polymers are anionic and have a molecular weight of about 5,000 to 2,000,000 and preferably 100,000 to 500,000. Examples of useful anionic polymers include isobutylene-maleic anhydride copolymer, styrene-maleic anhydride copolymer, acrylic acid copolymers, styrene sulfonic acid polymers and copolymers. Amphoteric high polymers can also be used such as gelatin and the like.

Specific examples of maleic anhydride copolymers (including hydrolysis products thereof) include methyl vinyl ether/maleic anhydride copolymer, ethylene/maleic anhydride copolymer, vinyl acetate/maleic anhydride copolymer, methacrylamide/maleic anhydride copolymer, isobutylene/maleic anhydride copolymer, styrene/maleic anhydride copolymer and so on. A preferred molecular weight of such copolymers is within the range of from 5,000 to 2,000,000.

Specific examples of acrylic acid copolymers which can be used include methylacrylate/acrylic acid copolymer, ethylacrylate/acrylic acid copolymer, methylacrylate/methacrylic acid copolymer, ethylmethacrylate/acrylic acid copolymer, methylmethacrylate/methacrylic acid copolymer, methylacrylate/acrylamide/acrylic acid copolymer, acrylonitrile/acrylic acid copolymer, acrylonitrile/methacrylic acid copolymer, hydroxyethylacrylate/acrylic acid copolymer, hydroxyethylmeth-acrylate/methacrylic acid copolymer, vinylacetate/acrylic acid copolymer, vinylacetate/methacrylic acid copolymer, acrylamide/acrylic acid copolymer, acrylamide/methacrylic acid copolymer, methacrylamide/acrylic acid copolymer, methacrylamide/methacrylic acid copolymer, and alkali metal salts thereof. A preferred molecular weight of such acrylic acid copolymers is within the range of from 20,000 to 1,000,000, and a preferred fraction of acrylic acid or methacrylic acid (or a salt thereof) in the copolymers as set forth above is from 5 to 100 mol %.

Specific examples of vinylbenzenesulfonic acid copolymers include methylacrylate/vinylbenzenesulfonic acid (or a salt thereof) copolymer, vinylacetate/vinylbenzenesulfonic acid copolymer, acrylamide/vinylbenzenesulfonic acid copolymer, acryloylmorpholine/vinylbenzenesulfonic acid copolymer, vinylpyrrolidone/vinylbenzenesulfonic acid copolymer, and so on. A preferred molecular weight of vinylbenzenesulfonic acid copolymers as set forth above ranges from 5,000 to 2,000,000, more preferably from 10,000 to 1,000,000, and particularly preferably from 20,000 to 500,000. Typical examples of sulfonated polystyrenes useful in the present invention are Versa TL500 and Versa T502B, products of National Starch Co. Useful sulfonated polystyrenes are generally characterized by a sulfonation degree of over 85% and preferably over 95%. The molecular weight of the sulfonated polystyrene is preferably greater than 100,000 and more preferably about 500,000 but other molecular weights can also be used. The sulfonated polystyrene is usually added to the aqueous phase in an amount of about 1 to 6% by weight.

Nonionic high polymers which can be used include both natural and synthetic ones. For example, —OH group containing high polymers can be cited. Specific examples of semisynthetic nonionic high polymers include hydroxyethyl cellulose, pullulan (noncrystalline, highly water-soluble macromolecular polysaccharide prepared from starch using a microbial fermentation method), soluble starch, oxidized starch and so on.

More particularly, it has been found that when the dispersant of formula (I) and an optimal concentration of sodium sulfate or other salting-out salts (i.e., salts which induce precipitation of a polymer) with or without a sulfonated polystyrene) are dissolved in the aqueous medium and the capsule wall is formed in an otherwise conventional manner, microcapsules of a more uniform, controlled, small size are obtained. When these microcapsules are used in forming photosensitive imaging sheets as described in the aforementioned patents, the imaging sheets exhibit improved film speed and a more uniform photographic response.

Photosensitive microcapsules obtained in accordance with the present invention may have an average particle size in the range of about 5 to 10 microns depending on the concentration of dispersant and the shear rate used in the preparation. In accordance with one particular embodiment of the invention microcapsules having an average particle size of 10 microns and a size distribution of 2 to 20 microns are obtained. Because of their uniform small size these microcapsules are particularly useful in forming photosensitive imaging sheets.

In preparing microcapsules in accordance with this invention the composition which will become the internal phase of the microcapsules is prepared. This composition is referred to herein as the "oil phase" because it is typically made up of oily organic based components, however, in microencapsulating photohardenable compositions containing a silver halide, it is actually a water-in-oil emulsion. The silver halide is emulsified into the oily monomer.

In most cases it is desirable to add a polyisocyanate or a prepolymer thereof to the oily core material. This practice is described in detail in U.S. Pat. No. 4,353,809. The polyisocyanate is believed to react with water at the interface of the core material and the aqueous medium and form a thin layer of crosslinked polymer which further stabilizes the emulsion. Preferred polyisocyanates are SF-50, an aromatic trisocyanate manufactured by Union Carbide, and Desmodur N-100, a biuret of hexamethylene diisocyanate and water available from Mobay Chemical Co. The isocyanate is typically added in an amount of about 0.005 to 3 parts per 100 parts of the core material and preferably 0.01 to 2 parts.

The terminology polyisocyanate refers to compounds containing two or more isocyanate groups, and specific examples thereof include diisocyanates such as m-phenylenediisocyanate, p-phenylenediisocyanate, 2,6-tolylenediisocyanate, 2,4-tolylenediisocyanate, naphthalene-1,4-diisocyanate, 4,4'-diphenylmethanediisocyanate, 3,3'-dimethoxy-4,4'-biphenyldiisocyanate, 3,3'-dimethyldiphenylmethane-4,4'-diisocyanate, xylylene-1,4-diisocyanate, xylylene-1,3-diisocyanate, 4,4'-diphenylpropanediisocyanate, trimethylenediisocyanate, hexamethylenediisocyanate, propylene-1,2-diisocyanate, butylene-1,2-diisocyanate, ethylidinediisocyanate, cyclohexylene-1,2-diisocyanate, cyclohexylene-1,4-diisocyanate, etc.; triisocyanates such as 4,4',4''-triphenylmethanetriisocyanate, toluene-2,4,6-triisocyanate, polymethylenepolyphenyltriisocyanate, etc.; tetraisocyanates such as 4,4'-dimethyldiphenylmethane-2,2',5,5'-tetraisocyanate, etc.; polyisocyanate prepolymers such a polymethylenepolyphenylpoltyisocyanate, addition products of hexamethylenediisocyanate and hexanetriol, addition products of 2,4-tolylenediisocyanate and Brenzcatechin, addition products of tolylenediisocyanate and hexanetriol, addition products of tolylenediisocyanate and trimethylol-propane, addition products of xylylenediisocyanate and trimethylolpropane, addition products of hexamethylenediisocyanate and trimethylolpropane, etc.; and any suitable polyisocyanates which are analogous to the above-described ones. It is also possible to employ a combination of two or more of the foregoing polyisocyanate.

The aqueous phase is prepared by dissolving the dispersant of formula (I) in water. In most embodiments, a water-soluble polymer or a salting-out salt such as sodium sulfate must also be added to the aqueous phase. The preferred polymer is sulfonated polystyrene.

After the dispersant and the salting-out salt or water-soluble polymer have been added, the pH of the aqueous phase is adjusted to a pH suitable for the amine-formaldehyde condensation reaction. Generally, a pH of about 4.0 is useful in making urea-formaldehyde microcapsules whereas a pH of 6.0 is used in making melamine-formaldehyde capsules.

Emulsification of the oil phase into the aqueous phase is preferably conducted under conditions which afford an emulsion having an average particle size in the range of about 2.5 to 5.0 microns. The observed particle size of the emulsion is somewhat smaller than the particle size of the capsules produced. Typically, the emulsion is prepared by adding an oily material to be encapsulated to an aqueous phase containing the viscosity modifier while stirring or otherwise agitating the aqueous phase to achieve the desired emulsion particle size. The aqueous phase may also include other capsule wall forming materials or agents in a manner well known in the art. Blending is continued until an average emulsion particle size of about 3.5 microns has been achieved whereupon solutions of the amine and formaldehyde or a solution of a precondensate thereof are/is added to the emulsion and the capsule walls gradually form.

The present invention is particularly directed to forming microcapsules in which the oily core material is enwrapped in an amine-formaldehyde condensation product. Such microcapsules are formed by in situ condensation of formaldehyde and an amine such as urea, melamine, dimethylol urea, and the like or a pre-condensate thereof. The condensation product can be modified by the co-condensation of a polyhydric phenol such as resorcinol if desired.

Suitable polyhydric phenols that may be added to the reaction system for co-condensation with the amine and formaldehyde to improve impermeability are resorcinol, catechol, gallic acid, and the like. The phenols may be added in an amount of about 5 to 30% by weight based on the amount of urea.

The specific techniques described herein for the amine-formaldehyde microcapsules are purely illustrative. The processes of the present invention are characterized by the use of the dispersant of formula (I). Other known techniques for preparing the amine-formaldehyde microcapsules may be modified by using the dispersant of formula (I) and still fall within the scope of the present invention. Among many well-known encapsulation techniques that can be used in the present invention are: Kiritani et al, U.S. Pat. No. 3,796,669 for urea-resorcinol-formaldehyde capsules; Forris et al, U.S. Pat. Nos. 4,001,140; 4,087,376 and 4,089,802 for melamine-formaldehyde capsules.

Addition of the oil phase to the water phase provides an oil-in-water (O/W) emulsion or a water-in-oil-in-water (W/O/W) emulsion in the case of making silver based photosensitive microcapsules. The agitating O/W or W/O/W emulsion is brought to a temperature suitable for the condensation reaction and solutions of the amine and formaldehyde or precondensates are added. On reaction, any amine-formaldehyde condensate separates from the solution which wets and enwraps the capsule core material. After the walls have been solidified, the capsules may be separated from the medium and washed. One method in accordance with the present invention involves the following steps.

(i) Preparing an aqueous solution of the formula (I) dispersant and a salting-out salt such as sodium sulfate or a water-soluble polymer such as sulfonated polystyrene and adjusting pH (ii) Emulsifying the core material in the aqueous solution (iii) Adding amine and formaldehyde or amine-formaldehyde precondensate to the system (iv) Adjusting pH (v) Polymerizing the amine and formaldehyde while stirring the system (vi) Heating (vii) Reacting the excess formaldehyde.

To prepare microcapsules having melamine-formaldehyde walls, the following procedures can be used:
(i) Preparing an aqueous solution of the compound of formula (I) and a salting-out salt such as sodium sulfate or a sulfonated polystyrene and adjusting pH
(ii) Emulsifying the core material in the aqueous solution
(iii) Adding melamine-formaldehyde precondensate to the system
(iv) Adjusting pH
(v) Polymerizing pre-condensate
(vi) Heating
(vii) Reacting excess formaldehyde.

Another process involves the following sequence of steps:
Emulsifying an oil in an aqueous acid solution containing the compound of formula (I) and sulfonated polystyrene
(ii) Adding an aqueous solution of urea
(iii) Adding an aqueous solution of resorcinol
(iv) Adding an aqueous solution of formaldehyde
(v) Heating to 65° C.
(vi) Adjusting the pH to 9.0
(vii) Adding a solution of sodium acid sulfite to scavenge excess formaldehyde
(viii) Removing an aqueous dispersion of the microcapsules.

The condensation reaction proceeds under acid conditions, e.g., pH of 7 or less; however, the reaction is preferably carried out at a pH in the range of 2.5 to 6.0. The temperature of the encapsulation medium should be maintained at about 10° to 95° C., preferably about 25° to 85° C. and more preferably about 45° to 75° C.

Among the acid catalysts that may be used are low molecular weight carboxylic acids, e.g., formic acid, acetic acid, etc.; inorganic acids, e.g., sulfuric acid, hydrochloric acid, phosphoric acid, etc.; and acidic or easily hydrolyzable salts such as aluminum sulfate, ammonium nitrate, ammonium chloride, ammonium sulfate, etc. Ammonium salts are preferred as they seem to provide a stronger and less permeable capsule. The ammonium salts are usually employed in an amount of about 2 to 20% by weight based on the amount of urea.

The amine and formaldehyde are preferably present in the encapsulation medium, whether as the free monomer or a precondensate, in a molar ratio of formaldehyde to amine of at least 1.5 and preferably about 2.0 to 3.0.

To prepare silver based photosensitive microcapsules, the following procedure may be used:
(i) emulsify a silver halide emulsion into solution of monomer and surfactant and reducing (developing) agents;
(ii) emulsify the W/O emulsion from step (i) into aqueous phase containing the dispersant of formula (I) and a salting-out salt such as sodium sulfate or a water-soluble polymer such as sulfonated polystyrene.
(iii) add melamine-formaldehyde precondensate to the emulsion of step (ii) while continuing agitation and adjust pH to 6.0.
(iv) polymerize precondensate
(iv) add urea
(v) adjust pH to 6.5 to 6.7 and allow slurry to cool.

To emulsify the silver halide emulsion into the oil phase, certain surface active agents or dispersing polymers may be used and, particularly, polymers having pendant hydrophilic groups terminated by hydroxyl or amino groups. polymers useful for this purpose are disclosed in the referenced European patents One useful polymer is a hydroxyethyl methacrylate-methacrylic acid copolymer.

The process of the present invention is advantageously used to produce microcapsules for use in photographic or pressure-sensitive recording papers. These dispersants may also be useful in providing products in the Pharmaceutical and cosmetic industry. In the latter embodiment, the core material is typically a substantially colorless color former dissolved in an oil. In the latter embodiment, the core material is typically a photosensitive composition containing a color former.

The internal phase composition is not part of the present invention. It will vary with the nature of the photographic product. For examples of useful photosensitive internal phase compositions, reference should be made to the U.S. Patents and European applications cited in the Background. For illustration only, the following discussion is provided.

Typical photohardenable compositions include a photoinitiator and a monomer, dimer, or oligomer which is polymerized to a higher molecular weight compound, or a polymer which is crosslinked upon exposure. Ethylenically unsaturated organic compounds are particularly useful. These compounds contain at least one terminal ethylene group per molecule. Typically, they are liquid and can double as a diluent oil for the internal phase. Ethylenically unsaturated compounds having two or more terminal ethylene groups per molecule are preferred. An example of this preferred subgroup is ethylenically unsaturated acid esters of polyhydric alcohols, such as trimethylol propane triacrylate (TMPTA). A preferred photoinitiator is a cyanine dye borate Some preferred photosensitive compositions are described in U.S. Pat. No. 4,772,541.

In the most typical case, color images are formed by image-wise releasing an image-forming agent from the capsules. The image-forming agent may be a dye or pigment but it is most typically a color precursor. Typical examples of color precursors useful in the present invention in providing photosensitive or pressure-sensitive systems include colorless electron donating type compounds. Representative examples of such color formers include substantially colorless compounds having in their partial skeleton a lactone, a lactam, a sultone, a spiropyran, an ester or an amino structure such as triarylmethane compounds, bisphenylmethane compounds, xanthene compounds, fluorans, thiazine compounds, spiropyran compounds and the like. Crystal Violet Lactone and Copikem IV and XI (all products of Hilton-Davis Co.) are often used alone or in combination as color precursors in the present invention. Numerous other examples can be found in the carbonless paper art. In a silver based photographic product a color precursor must be selected which does not adversely interact with that system. An example of a yellow color precursor is 4(r-dimethylaminophenol)-2,6-diphenylpyradine; a cyan color precursor is Crystal Violet Lactone; a magenta color precursor is Pargascript Red.

Useful color developer materials for preparing the self-contained sheets of the present invention are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy haphthoate, zinc 3,5 di-tert butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof. These compounds are generally referred to as electron accepting type compounds. Preferred developers coalesce into a film which imparts gloss to the image upon heating. Some examples are described in U.S. application Ser. No. 073,036 filed July 14, 1987.

Any ordinary coating or printing technique may be used to make the pressure-sensitive or photosensitive sheets of the present invention The techniques described in U.S. Pat. No 4,010,292 are useful.

The substrate upon which the capsules are coated may be paper (e.g., commercial impact raw stock, cast-coated paper, chrome-rolled paper, etc.) foil, but is preferably a plastic film (e.g , aluminized PET film). Because the silver-based compositions must be heated, in that embodiment the base must be thermally resistant.

The present invention is illustrated in more detail by the following non-limiting examples:

EXAMPLE 1

A solution of 55.5 g sodium styrene sulfonate, 55.5 g PEO-40 methacrylate, 800 g deionized water was prepared and the pH was adjusted to 4.5 with sulfuric acid. Under nitrogen, the solution was heated to 60° C. and a catalyst solution of 0.66 g ammonium persulfate and 10 g deionized water was added. The solution was heated to about 69° C. and held 60 minutes. Thereafter a solution of 55.5 g sodium styrene sulfonate, 55.5 g PEO-400 methacrylate, 775 g deionized water (pH adjusted to 4.5), and 0.9 g ammonium persulfate was added dropwise over a period of 5 hours while maintaining the temperature at about 69° C. After completing the dropwise addition, the reaction vessel was heated to about 74° C. for about 2 hours.

EXAMPLE 2

Preparation of Melamine-formaldehyde Photosensitive Microcapsules 60 g TMPTA was heated to 60° C. With the TMPTA solution at 60° C., 4.8 g of (25% solution) a hydroxymethylmethacrylate-methacrylic acid copolymer (a silver halide dispersant) was added to the TMPTA and the solution was held 30 minutes 6.0 g of the leuco dye color precursor was dissolved in the TMPTA solution and stirred for 30 minutes while maintaining the temperature at 60° C. with a water bath. 0.5 g Igepal CO-610 (nonylphenoxypoly(ethyleneoxy)ethanol a nonionic surfactant available from GAF) was weighed into a 250 cc glass beaker and the oil phase was added to the beaker. (This surfactant is believed to improve the reactivity of the silver with the base upon development and also affects capsule size distribution.) The beaker was placed on a hot plate and the oil phase was stirred and maintained at 60° C.

4.3 g 1-formyl-2-[4-(2-(2,4-di-tert-pentylphenoxy)-butylamide)phenyl]hydrazine and 4.1 g 2-phenysulfonyl-amino-4-hexadecyl-oxy-s-tert-octylphenol were dissolved in 13.2 g methylene chloride with sonification and the solution was added to the oil phase and stirred for 5 minutes. 120 mg benzotriazole was dissolved in 10 g of silver iodobromide gelatin emulsion at 45° C. and emulsified into the oil phase by stirring at 15,000 rpm for 5 minutes while maintaining the temperature at 45° C. 3.0 g Takenate D110-N (a polyisocyanate available from Takeda Chemical Industries, LTD, Tokyo, Japan) was added to the emulsion and mixing was continued at 15,000 rpm for 1.5 minutes. The emulsion was then checked under a microscope at 400X to verify that the silver halide was uniformally dispersed therein.

82.0 g of the emulsion prepared above was emulsified into 125 g of a solution containing 1% by weight VERSA 502A (a sulfonated polystyrene available from National Starch) and 5% by weight of the emulsifier from Example 1 above at 200 rpm for 30 minutes at 40° C. to prepare a W/O/W emulsion. This emulsion was heated to 60° C. at 1500 rpm and maintained for 15 minutes. A solution of a melamine-formaldehyde (MF) prepolymer was prepared by adding 23 g melamine and 38 g formaldehyde (37% solution) to water and stirring at 600 rpm in 60° C. The pH of the solution was adjusted to 8.5 with 10% NaOH and the solution was allowed to cure for 1 hour. 43.5 g of the MF precursor was weighed into a heated beaker and added to the emulsion at 60° C., 1500 rpm. The pH was adjusted to 6.0 with 10% sulfuric acid and the emulsion was covered and cured while stirring at 1500 rpm for 90 minutes. Urea 15.4 g (50%) was added to the emulsion with stirring for an additional 40 minutes. The microcapsule dispersion was allowed to cool and the pH was adjusted to 6.5-6.7 with stirring at 500 rpm. During preparation of the microcapsules, samples of the emulsion were tested for particle size at 20, 40 and 60 minutes after the addition of the MF prepolymer and for wall permeability at 5 and 40 minutes after addition of the prepolymer. An electron microscope photograph of the microcapsules is shown in FIG. 1. The microcapsules had the particle size distribution shown in the Table 1 below.

COMPARISON EXAMPLE

Figure 2:
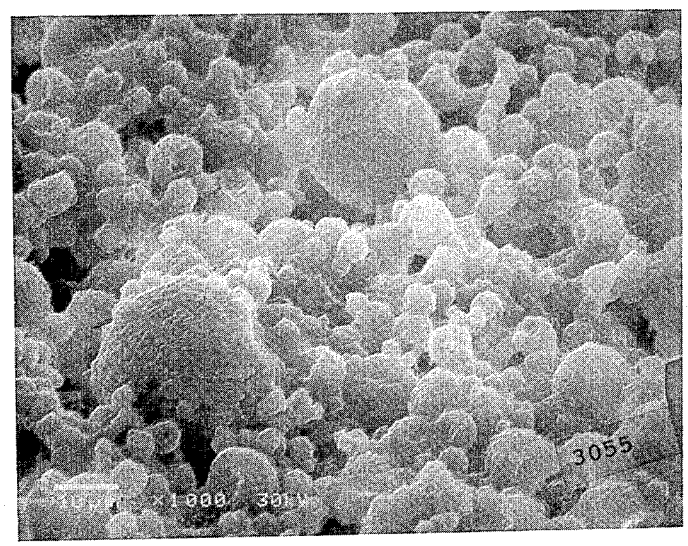

For comparison, photosensitive microcapsules were prepared using the same procedure as in Example 2 except the aqueous phase did not contain the dispersant from Example 1 but contained 10% VERSA 502A. The microcapsules are shown in FIG. 2. They had the particle size distribution shown in Table 1.

TABLE 1

| Diameter (m) | Ex 2 (%) | Comparison (%) |
|---|---|---|
| >20 | 0 | 0 |
| 20–18 | 3.4 | 7.8 |
| 18–16 | 7.0 | 14.7 |
| 16–14 | 7.9 | 10.3 |
| 14–12 | 11.3 | 10.7 |
| 12–10 | 17.8 | 9.2 |
| 10–8 | 19.0 | 11.6 |
| 8–6 | 25.3 | 15.1 |
| 6–4 | 3.0 | 18.2 |
| 4–2 | 2.8 | 1.6 |
| 2–0 | 2.5 | 0.8 |
| median | 9.73 | 10.59 |

Having described the invention in detail and by reference to specific embodiments thereof, it will be apparent that numerous modifications and variations are possible without departing from the scope of the invention defined by the following claims.

What is claimed is:

1. A compound of the formula (I):

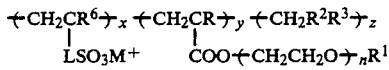

where:
M is an alkali metal cation or a quaternary ammonium group,
L is —(CH$_2$)$_p$, —COO(CH$_2$)$_p$, —C$_6$H$_4$— or a direct bond,
R, R$^2$ and R$^6$ are the same or different and represent a hydrogen atom or a methyl group;
R$^1$ is a hydrogen atom, an alkyl group having 1 to 4 carbon atoms, or —SO$_3$M where M is defined as above; R$^3$ is —COOR$_4$, —CO—R$^4$, —CONHR$_4$, a pyridinyl group or quaternary salt thereof, —COOCH$_2$CH$_2$N(CH$_3$)$_2$, —COOCH$_2$CH$_2$N$^+$(CH$_3$)$_3$Cl— where R$^4$ is an alkyl group having 1 to 12 carbon atoms, an aralkyl group, an aryl group or —(CH$_2$)$_m$ —OOC—CR$^2$CH$_2$, —(OCH$_2$CH$_2$)$_m$ COO—CR$^2$CH$_2$ or —(CH$_2$)$_m$ NHCO—CR$^2$CH$_2$;
x is about 0.4 to 0.8;
y is about 0.2 to 0.6;
z is about 0 to 0.1;
n is an integer greater than or equal to 1;
m is an integer of 1 to 4; and
p is an integer of 0 to 4.

2. The compound of claim 1 wherein x is about 0.5 to 0.7, y is about 0.3 to 0.5 and z is about 0.005 to 0.05.

3. The compound of claim 1 wherein L is a direct bond.

4. The compound of claim 3 wherein n is 4 to 30.

5. The compound of claim 4 wherein a 5% solution of said compound in water exhibits a viscosity at 25° C. in the range of 30 to 500 cps.

6. The compound of claim 5 wherein R$^3$ is a pyridinyl group or a quaternary salt thereof, a group of the formula —COOR$^4$ is an alkyl group having 6 to 10 carbon atoms or R$^4$ is —(CH$_2$)$_m$—OOC—CR$^2$CH$_2$.

7. A process for forming microcapsules having discrete capsule walls comprising the steps of forming an emulsion of an oily core material in a continuous aqueous phase containing a compound of the formula (I):

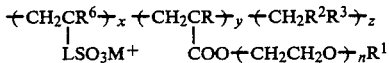

where:
M is an alkali metal cation or a quaternary ammonium group,
L is —(CH$_2$)p, —COO(CH$_2$)p, —C$_6$H$_4$— or a direct bond,
R, R$^2$ and R$^6$ are the same or different and represent a hydrogen atom or a methyl group;
R$^1$ is a hydrogen atom, an alkyl group having 1 to 4 carbon atoms, or —SO$_3$M where M is defined as above; R$^3$ is —COOR$^4$, —COR$^4$—CONHR$^4$, a pyridinyl group or quaternary salt thereof, —COOCH$_2$CH$_2$N(CH$_3$)$_2$, —COOCH$_2$CH$_2$N$^+$(CH$_3$)$_3$Cl— where R$^4$ is an alkyl group having 1 to 12 carbon atoms, an aralkyl group, an aryl group, or —(CH$_2$)$_m$ —OOC-CR$^2$CH$_2$, —(OCH$_2$CH$_2$)m COO—CR$^2$CH$_2$ or —(CH$_2$)m NHCO—CR$^2$CH$_2$;
x is about 0.4 to 0.8;
y is about 0.2 to 0.6;
z is about 0 to 0.1;
n is an integer greater than or equal to 1 and preferably 4 to 30;
m is an integer of 1 to 4;
p is an integer of 0 to 4;
and enwrapping particles of said oily core material in an amine formaldehyde condensation produced in situ condensation of any amine and formaldehyde.

8. The process of claim 7 wherein said amine is urea or melamine.

9. The process of claim 8 wherein said formaldehyde condensation product is a melamine-formaldehyde resin.

10. The process of claim 7 wherein x is about 0.5 to 0.7, y is about 0.3 to 0.5 and z is about 0.005 to 0.05.

11. The process of claim 7 wherein L is a direct bond.

12. The process of claim 11 wherein n is 4 to 30.

13. The process of claim 12 wherein a 5% solution of said compound in water exhibits a viscosity at 25° C. in the range of 50 to 300 cps.

14. The process of claim 7 wherein said continuous aqueous phase additionally contains a water-soluble polymer.

15. The process of claim 14 wherein said water-soluble polymer is a sulfonated polystyrene.

16. The process of claim 13 wherein R$^3$ is a pyridinyl group or quaternary salt thereof, a group of the formula —COOR$^4$, —CO—R$^4$, or —CONHR$^4$, where R$^4$ is an alkyl group having 6 to 10 carbon atoms or R$^4$ is —(CH$_2$)$_m$—OOC—CR$^2$CH$_2$, —(OCH$_2$CH$_2$)$_m$ COO—CR$^2$=CH$_2$, or —(CH$_2$)$_m$ NHCO—CR$^2$=CH$_2$.

17. The process of claim 7 wherein said oily core material contains a photohardenable composition.

18. The process of claim 17 wherein said photohardenable composition is a silver based composition and said oily core material is an emulsion of a silver halide dispersed in a monomer.

19. The process of claim 18 wherein R$^1$ is a methyl group in formula (I).

20. An imaging sheet comprising a support carrying on one surface thereof a layer of microcapsules having discrete capsule walls, said microcapsules containing a photohardenable composition in the internal phase and being formed by enwrapping particles of an oil-in-water emulsion containing a compound of the formula (I):

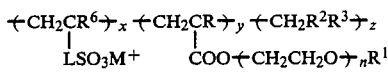

where:
M is an alkali metal cation or a quaternary ammonium group.
L is —(CH$_2$)p, —COO(CH$_2$)p, —C$_6$H$_4$— or a direct bond,
R, R$^2$ and R$^6$ are the same or different and represent a hydrogen atom or a methyl group;
R$^1$ is a hydrogen atom, an alkyl group having 1 to 4 carbon atoms, or —SO$_3$M where M is defined as above; R$_3$ is —COOR$_4$, —CO—R$_4$, —CONHR$_4$, a pyridinyl group or quaternary salt thereof, —COOCH$_2$CH$_2$N(CH$_3$)$_2$, —COOCH$_2$CH$_2$N$^+$(CH$_3$)$_3$Cl— where R$^4$ is an alkyl group having 1 to 12 carbon atoms, an aralkyl group, an aryl group, or —(CH$_2$)$_m$—OOC—CR$_2$CH$_2$, —(OCH$_2$CH$_2$)$_m$ COO—CR$_2$=CH$_2$ or —(CH$_2$)$_m$ NHCO—CR$_2$=CH$_2$;

x is about 0.4 to 0.8;
y is about 0.2 to 0.6;
z is about 0 to 0.1;
n is an integer greater than or equal to 1 and preferably 4 to 30;
m is an integer of 1 to 4;
p is an integer of 0 to 4; and
where said particles are in a formaldehyde condensation product produced by in situ polymerization of formaldehyde and an amine, and said capsules being further characterized by an average particle size of about 4 to 15 microns and not less than 90% of said capsules having a particle size less than 25 microns.

21. The imaging sheet of claim 20 wherein said condensation product is a melamine-formaldehyde resin.

22. Microcapsules prepared by the process of claim 7.

23. The compound of claim 1 wherein L is $-C_6H_4-$.

24. The process of claim 7 wherein L is $-C_6H_4-$.

25. The imaging sheet of claim 20 wherein L is $-C_6H_4-$.

* * * * *